United States Patent [19]

Cox et al.

[11] 4,025,799
[45] May 24, 1977

[54] DECODER STRUCTURE FOR A FOLDED LOGIC ARRAY

[75] Inventors: Dennis T. Cox, Kingston; Se J. Hong; Daniel L. Ostapko, both of Poughkeepsie, all of N.Y.

[73] Assignee: IBM Corporation, Armonk, N.Y.

[22] Filed: Nov. 6, 1975

[21] Appl. No.: 629,260

[52] U.S. Cl. .............................. 307/207; 235/152; 307/205; 307/DIG. 5; 328/92
[51] Int. Cl.² .................... H03K 19/20; G11C 5/06
[58] Field of Search ........... G11C/8/02; G06F/7/38; 235/152; 307/205, 207, 270, DIG. 5; 328/92, 103

[56] References Cited

UNITED STATES PATENTS

| | | | |
|---|---|---|---|
| 3,816,725 | 6/1974 | Greer | 307/207 X |
| 3,829,846 | 8/1974 | Berg et al. | 235/152 X |
| 3,849,638 | 11/1974 | Greer | 307/207 X |
| 3,936,812 | 2/1976 | Cox et al. | 235/152 X |

OTHER PUBLICATIONS

Howley et al., "Programmable Logic Array Decoding Technique"; *IBM Tech. Discl. Bull.; vol. 17, No. 10, pp. 2988; Mar. 1975.*

Primary Examiner—John S. Heyman
Assistant Examiner—Larry N. Anagnos
Attorney, Agent, or Firm—James E. Murray

[57] ABSTRACT

This specification describes a decoder for use in a programmable logic array (PLA) of the type having opposite ends of input lines of the array connected to outputs of different decoders. Instead of using the outputs of two two-bit decoders to drive four input lines, as was previously done, four one-bit decoders are used to drive the four input lines. This arrangement permits the one-bit decoders with minor modifications to be used to perform four one-bit decodes of four input signals, two two-bit decodes on two sets of two input signals on either side of the array and one two-bit decode on two input signals that are on opposite sides of the array.

5 Claims, 7 Drawing Figures

DECODER STRUCTURE FOR A FOLDED LOGIC ARRAY

BACKGROUND OF THE INVENTION

The present invention relates to arrays for performing logic functions and, more particularly, it relates to a new decoder for PLAs.

Performing logic in an array of identical circuit elements each located at a unique intersection of an input and output line in a grid of input and output lines is well known. Co-pending application Ser. No. 537,219 filed on Dec. 30, 1974, Ser. No. 537,218, filed on Dec. 30, 1974; and Ser. No. 591,208, filed June 27, 1975 describe such a PLA in which a number of two-bit decoders feed inputs to a first array called a product term generator or an AND array which in turn supplies outputs to a second array called the sum of product term generator or an OR array. The input lines of these arrays can each have input variables fed to either or both ends. When input variables are fed to both ends of an input line the input line is segmented to separate logic functions performed on an input variable fed to one end from logic functions performed on input variables fed to the other end. The input variables fed to the input lines of the array are the four variables generated as the outputs of a two bit decoder. This permits the use of the four lines to perform logic functions involving two sets of variables where each set is made up of two variables fed to the same side of the array. Sometimes it is desirable that logic functions be performed on inputs of a single variable or that logic functions be performed on a set of two variables arranged on opposite sides of the array. This is not possible with the two-bit decoders now being used.

THE INVENTION

Therefore, in accordance with the present invention, a new decoder is provided that permits performing logic on functions of two variables both positioned on the same side of the AND array or two variables located on opposite sides of the AND array and to perform logic on functions of a single input variable. Instead of having each of the four input lines connected at opposite ends to the outputs of a different decoder, each of the four lines is conneced to two outputs of four one-bit decoders at each end. The lines are interconnected so that if two input variables are presented at each end they will perform the usual two-bit decoding of those two inputs.

However, if a single input is provided on either side two input decodes can be accomplished with those decoders by breaking some of the connections between one-bit decoders and the lines. Likewise a single bit decode can be accomplished by breaking other connections between the decoders and the lines.

Therefore, it is an object of the present invention to provide a new decoder for use with array logic.

It is another object of the present invention to provide a decoder that permits more variation in functions performed by it.

THE DRAWINGS

These and other objects can be best understood by referring to the accompanying figures of which:

PREFERRED EMBODIMENT OF THE INVENTION

Figure 1:
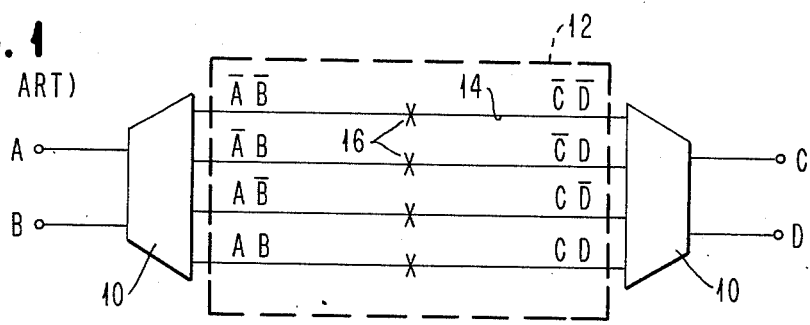
FIG. 1 is a schematic of the arrangement of decoders in the aforementioned patent applications.
Figure 2:
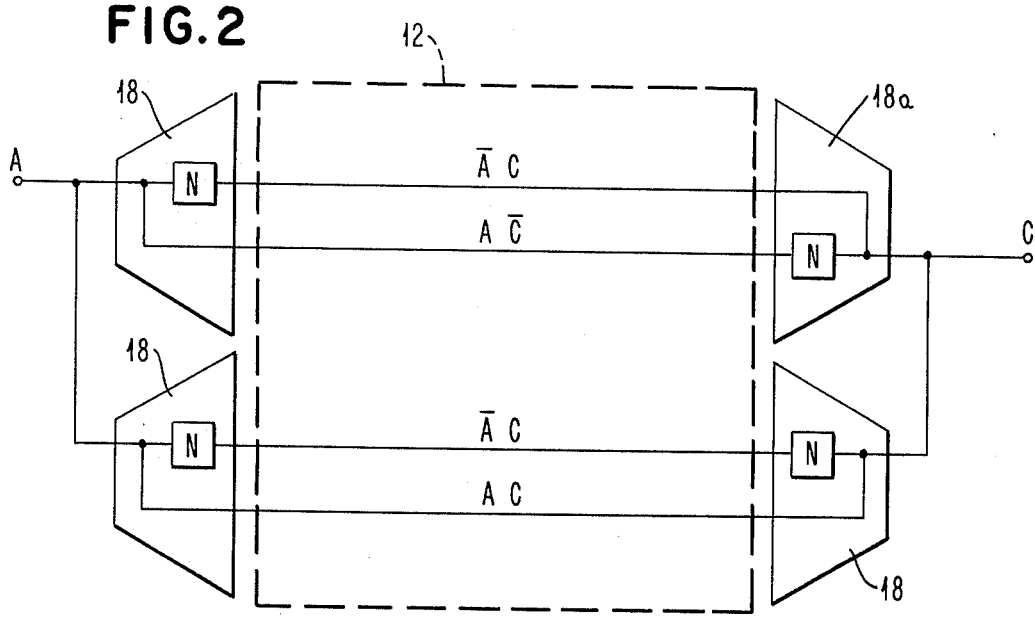
FIG. 2 is an electrical schematic of decoders interconnected in accordance with the present invention.

FIG. 1 shows the arrangement of input lines and decoders of the referenced patent applications. It can be seen that input variables A and B are presented to the inputs of a two-bit decoder 10 on one side of the array 12 while input variables C and D are presented to the inputs of a decoder 10 on the other side of the array 12. By breaking or segmenting the input lines 14 of the array 12 at some point 16 along their length, functions of the two different sets of input variables can be performed independently on different segments of the same four input lines 14. However, this arrangement does not permit the performing of functions on a set of two variables, say A and C arranged on opposite sides of the array. In FIG. 2 four one-bit decoders 18 are connected to four input lines 14 to generate the four combinations of two different variables located on opposite sides of the array. As can be seen, one of the four possible combinations of A and C decodes into one of the four input lines. It can be noticed that in the arrangement shown in FIG. 2 the position of the invert and true output lines in decoder 18I is the reverse of all the other decoders and the input lines 14 are not segmented in obtaining the four various combinations of A and C on the lines 14.

Figure 4:
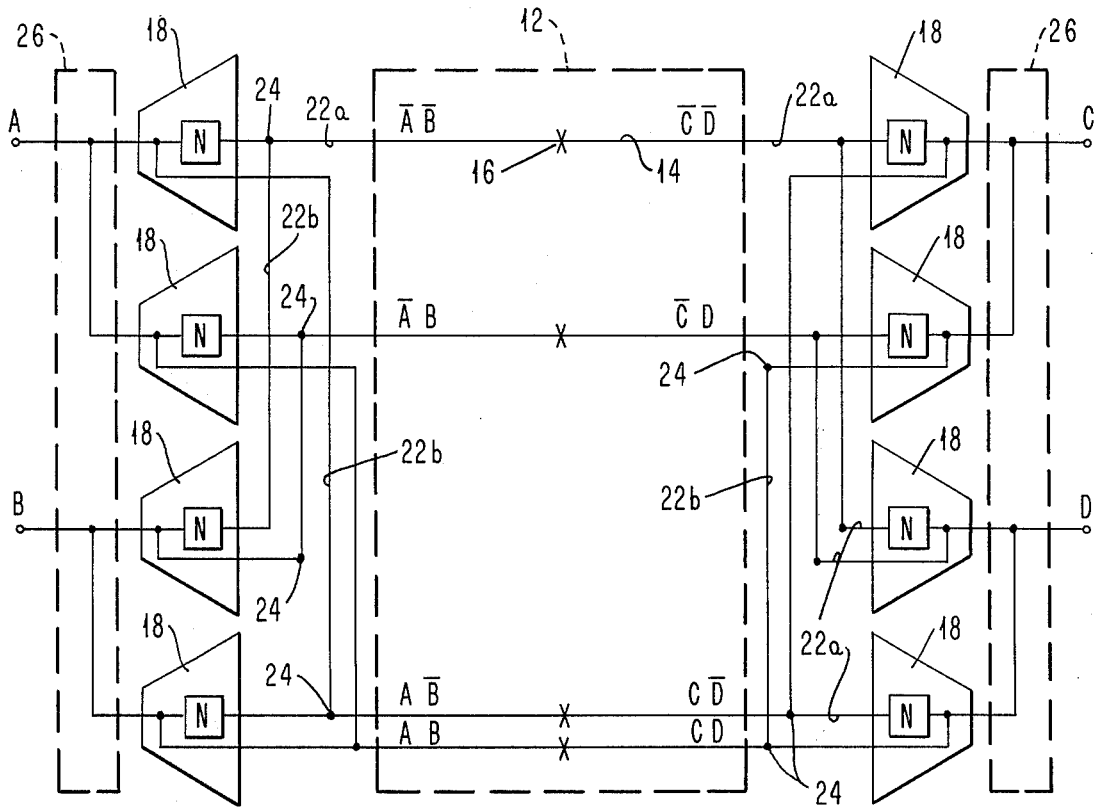
FIG. 4 is a drawing of input lines and decoders interconnected in accordance with the present invention.

In FIG. 4 it can be seen how single bit decoders 18 can be connected to the input lines 14 of the array 10 to provide the same decoding function as the two two-bit decoders shown in FIG. 1. Both ends of each of the lines 14 is connected to two outputs of the decoders 18 while one input is connected to each two decoders as shown. Breaks 16 are provided in the lines 14 to separate the functions of one set of variables A and B from the other set of variables C and D as is described in the mentioned prior art patent applications. The lines 14 of the array of course are metallization patterns on top of the oxide passivization layer which overlies the substrate on which the PLA is fabricated. Likewise, the horizontal portions 22a of each of the output lines 22 of the decoders in a metallization pattern on top of the insulating layer of the array. The vertical portions 22b of those output lines are diffusions into the substrate of the chip in which the array is configured. These diffusions are joined to the horizontal portions by plated-through holes or via's 24 through the oxide layer as described in the aforementioned patent applications. The inputs to the decoders 18 are through a rail 26 system as described in the aforementioned patent applications. Thus the inputs to the decoders 18 can be modified as desired to provide a variable connection input means, as can the input lines 14 of the array and the horizontal portions 22a of the output lines 22 of the decoders 18 to provide a variable connection output means and this can all be done by changing only the metallization pattern on top of the passivization layer. This variation in the decoder inputs and outputs permits the performing of two-bit decoding functions on variables like A and C arranged on opposite sides of the array and also permits a one-bit decode of four input variables A, B, C and D in addition to the decoding of two sets of inputs positioned in the same side of the array.

Figure 5:
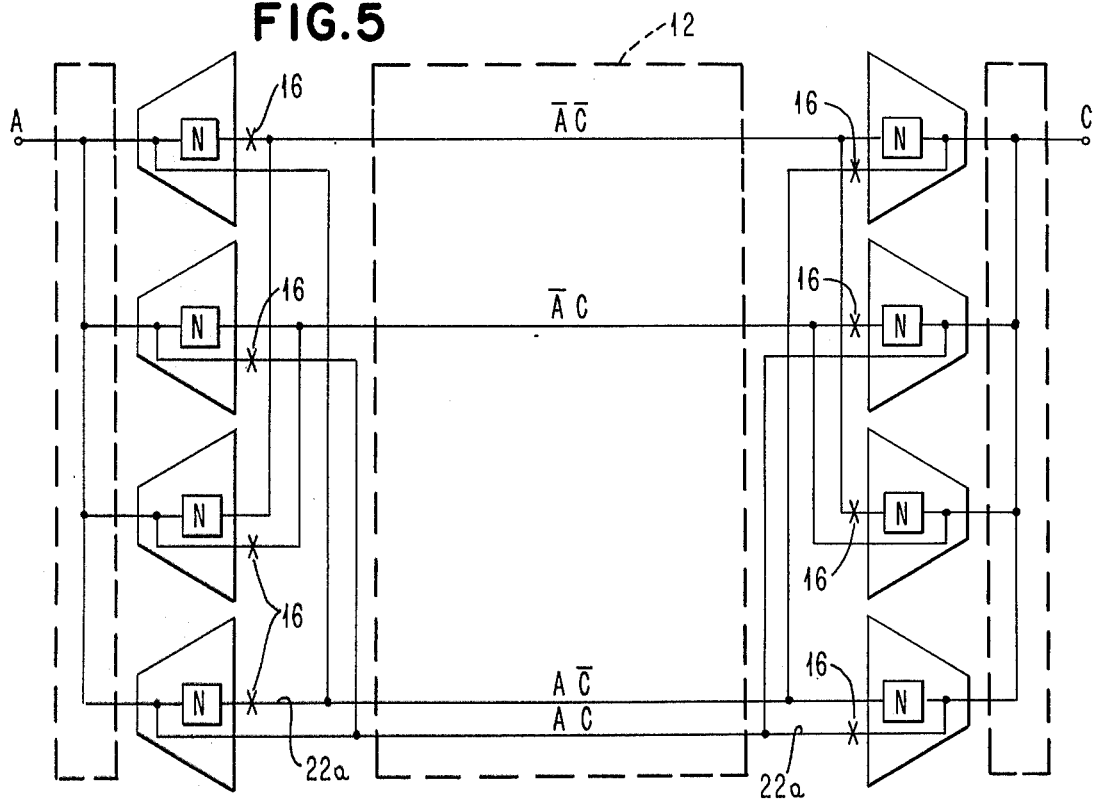
FIG. 5 shows the decoder of FIG. 4 modified to provide single bit decoding of four variables.

As shown in FIG. 5, the input lines to all of the decoders on one side are connected to the same input variable A or C while openings 16 are provided to certain of the horizontal portions 22b of the output lines to decode each of the lines 14 to one of the four combinations of the variables A and C. Of course, there are no openings in the input lines 14 of the array.

Figure 6:
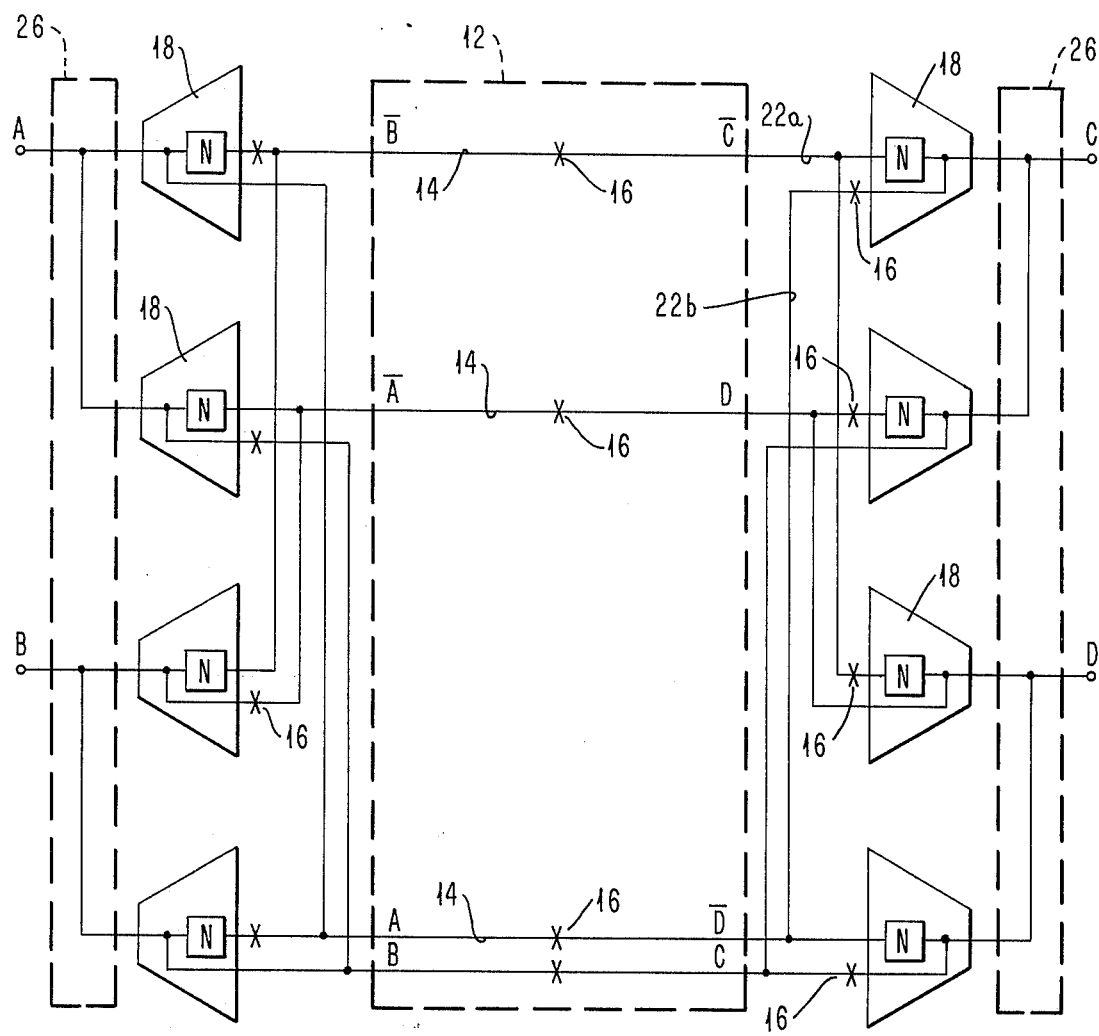
FIG. 6 shows the decoder of FIG. 4 modified to provide two bit decoding of variables arranged on opposite sides of the array; and, FIG. 7 is an electrical schematic of a different arrangement of decoders in accordance with the present invention.

FIG. 6 shows how the lines are segmented to perform a one-bit decode of two segments on each side of the array. The inputs to the decoders 18 are connected as they were in FIG. 4. In addition, like FIG. 4, all the input lines are broken at some point intermediate to their length to separate the functions performed on different variables on opposite sides of the array and certain horizontal sections of the output lines are broken to isolate the input lines 14 from undersirable outputs of the decoders 18.

Figure 3:
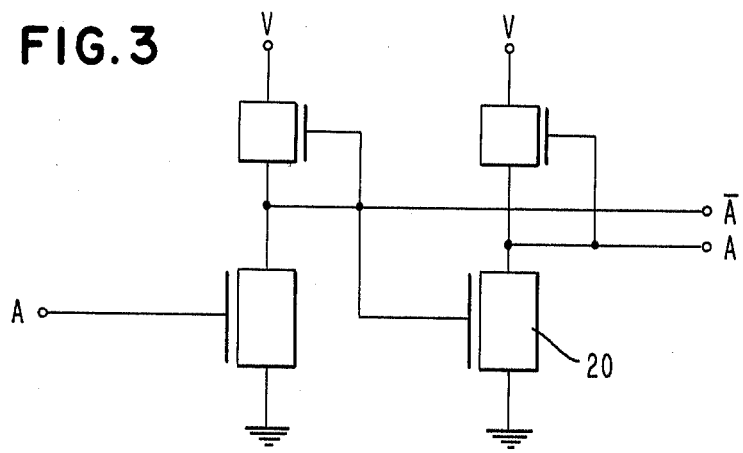
FIG. 3 is an electrical schematic of one of these decoders.

The decoders can be a two-stage switching circuit, such as shown in FIG. 3 in which the output of the stage provides the invert of the output signal while the output of the second stage provides the true of the input signal.

Figure 7:
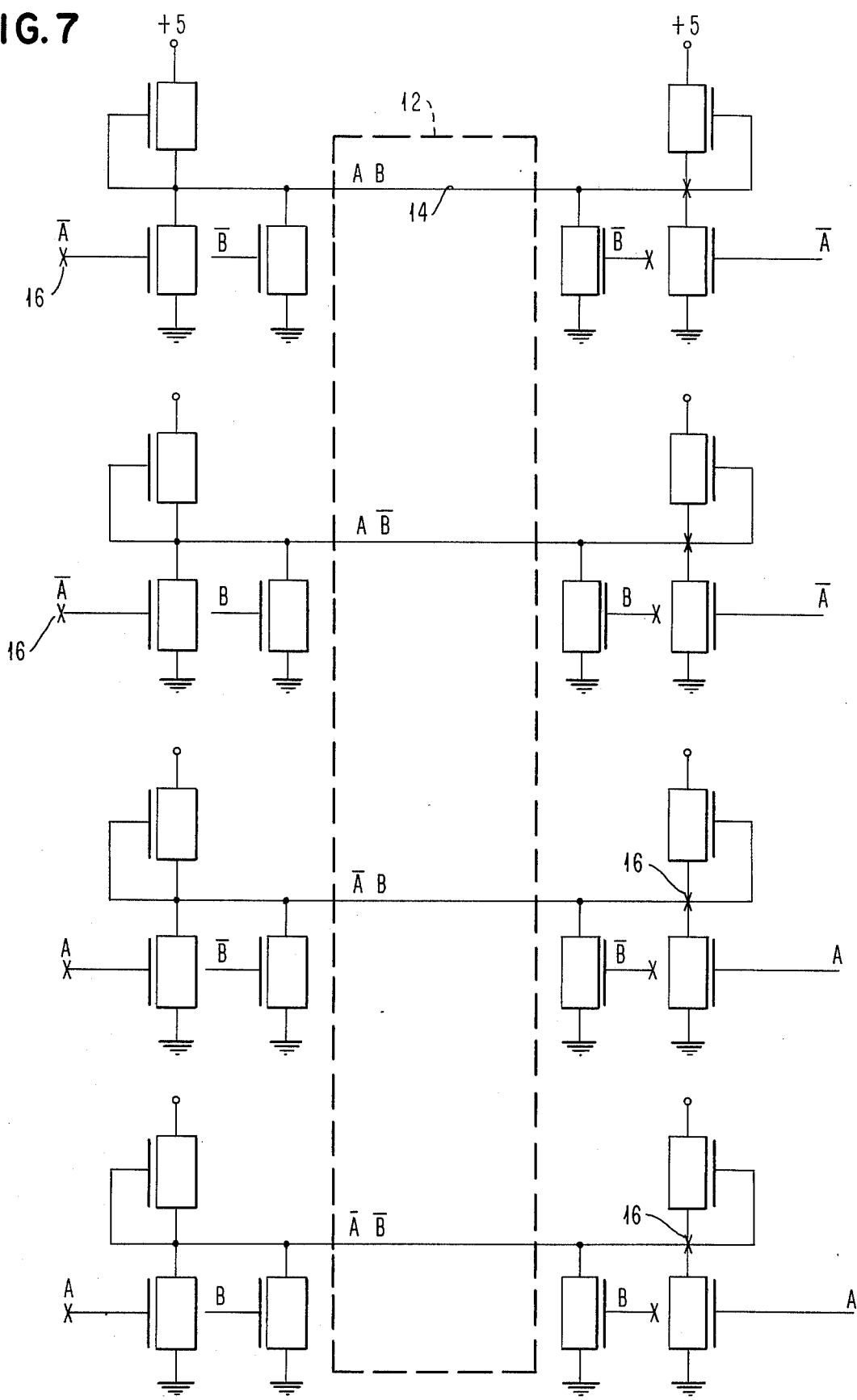

FIG. 7 is an alternative form of the invention described here and above. Here the breaks occur at the inputs to gating circuits that couple the decoders to the array lines and at certain of the excitation connections to the active devices in the drivers.

Above we have two embodiments of the invention. As can be seen, these embodiments permit the arrays not only to be used from decodes on two bits arranged on the same side of the array but also on bits arranged on opposite sides of the array and four single bits two positioned on each side of the array. Furthermore, it can be seen that modifications in the PLA layout required to obtain this variation can be obtained by changing only the metallization pattern on top of the passivization layer of the chip containing the PLA layout. Therefore, only one step in the manufacturing process for the array is affected to get this added flexibility of function for the array.

Therefore, while the invention has been particularly shown and described with reference to two preferred embodiments thereof, it will be understood by those skilled in the art that the above and other changes in form and details may be made therein without departing from the spirit and scope of the invention.

What is claimed is:

1. In a programmable logic array of the type comprising at least two arrays in which the first of the two arrays receives input variables on its input lines from decoders that generate these input variables from input signals and feeds the responses thereto on its output lines to the second of the two arrays, an arrangement for driving four selectively segmentable input lines at both ends of the first array comprising:

two sets of one-bit decoders positioned on each side of the first array each set opposite one end of the lines, variable connection input means coupled to the inputs of the decoders for personalizing the input connection to the decoders to select the input signals supplied to the decoders;

variable connection output means coupled between the outputs of the decoders and the input lines of personalizing the connections between the outputs of each set of decoders and the four input lines to select what decoder output is connected to which one or more of the four input lines whereby one or two-bit decoding of input signals supplied to the decoders can be suppled on the input lines of the first array.

2. The programmable logic array of claim 1;

wherein said variable input means couples all decoders on one side to one input signal, and all decoders on the other side to another input signal said variable output means couples the inverse of both signals to one unsegmented line, the true of both signals to another unsegmented line, the true of the one variable and the inverse of the other to a third unsegmented line and, the inverse of the one variable and the true of the other to a fourth unsegmented line.

3. The programmable logic array of claim 1 wherein, said variable input means couple each decoder to a separate input signal, said variable output means couples each decoder to a differnt pair of segments of the four input lines.

4. The programmable logic array of claim 1 wherein, the variable input means couples each two decoders on one side to a different input signal, the variable output means couples the inverse output of the decoder fed with one input signal and the inverse output of a decoder fed with the other input signal to a first segmented line, the true output of a decoder fed with one input signal and the true output of a decoder fed with the other input signal to a second segmented line, the true output of a decoder fed with one input signal and the inverse output of a decoder fed with the other input signal to a third segmented line, the inverse output of a decoder fed with the one input signal and the true output of a decoder fed with the other output signal to a fourth segmented line.

5. In a programmable logic array of the type comprising at least two arrays in which one of the arrays receives input variables on its input lines from decoders that generate these input variables from input signals and feeds the responses thereto on its output lines to a second array, an arrangement of decoders for driving four input lines of the first array with all possible combinations of a set of two binary input signals located on opposite ends of the lines comprising, a first plurality of one-bit decoders coupled to one end of the four input lines to feed the invert of the first of the input signals to the first and second of the four lines, and the true of the first input signals to the third and fourth of the four lines, a second plurality of one-bit decoders coupled to the other end of the four input lines to feed the true of the second of the input signals to the first and third lines and the inverse of the second input signals to the second and fourth lines.

* * * * *